United States Patent [19]

Gmitter et al.

[11] Patent Number: 4,883,561

[45] Date of Patent: Nov. 28, 1989

[54] LIFT-OFF AND SUBSEQUENT BONDING OF EPITAXIAL FILMS

[75] Inventors: Thomas J. Gmitter, Lakewood; Eli Yablonovitch, Middletown Township, Monmouth County, both of N.J.

[73] Assignee: Bell Communications Research, Inc., Livingston, N.J.

[21] Appl. No.: 279,217

[22] Filed: Dec. 5, 1988

Related U.S. Application Data

[63] Continuation-in-part of Ser. No. 174,852, Mar. 29, 1988, Pat. No. 4,846,931.

[51] Int. Cl.$^4$ .................... H01L 21/306; B44C 1/22; C03C 15/00; C03C 25/06

[52] U.S. Cl. ................................ 156/633; 156/655; 156/662; 156/249; 350/96.12

[58] Field of Search ............... 156/629, 630, 631, 633, 156/655, 662, 236, 247, 248, 249; 357/2, 4; 350/96.12

[56] References Cited

PUBLICATIONS

Klem et al., "Characteristics of Lift-Off Fabricated AlGaAs/InGaAs Single-Strained Quantum Well Structures on Glass and Silicon Substrates" Preprint Article, Sandia National Laboratories, Albuquerque, N.M., pp. 1-6.

M. Konagai et al., "High Efficiency GaAs Thin Film Solar Cells by Peeled Film Technology," *Journal of Crystal Growth*, 45, pp. 277-280 (1978).

K. Y. Lee et al., "Fabrication of Ultrasmall Devices on Thin Active GaAs Membrane," *Journal of Vacuum Science Technology* B5(1), 322-325, Jan./Feb. (1987).

J. C. C. Fan, "Thin Films of III-V Compounds and Their Applications," *Journal de Physique Colloquium*, 43, C1, 327-339 (1982).

D. L. Miller et al., "GaAs Peeled Film Solar Cells," Document #MRDC41056.49 FRD, Final Report Draft for the Period Mar. 15, 1980–Dec. 31, 1981, Prepared for Solar Energy Research Institute Under Subcontract No. X5-0-9002-2.

Yablonovitch et al., "Extreme Selectivity in the Lift-Off of Epitaxial GaAs Films", *Applied Physics Letters*, 51(26), 2222-2224 (Dec. 28, 1987).

*Primary Examiner*—William A. Powell
*Attorney, Agent, or Firm*—James W. Falk; Charles S. Guenzer

[57] ABSTRACT

A method for removing an epitaxial film from a single crystal substrate upon which it is grown and adhering the films to second substrate and the resultant structure. The removing method comprises (a) providing a thin release layer ($\leq 100$ nm) between the film to be grown and the single crystal substrate; (b) growing the epitaxial film; (c) applying a polymeric support layer which is under tension over the film; and (d) selectively etching the release layer, the tension in the support layer causing the edges of the film to curve upwardly as the release layer is etched away. The adhering method uses either adhesives or relies solely on Van der Waals bonding between the epitaxial film and the second substrate.

19 Claims, 8 Drawing Sheets

LIFT-OFF AND SUBSEQUENT BONDING OF EPITAXIAL FILMS

BACKGROUND OF THE INVENTION

Related Applications

This application is a continuation-in-part of Ser. No. 174,852, filed March 29, 1988, now issued as U.S. Pat. No. 4,846,931.

Field of the Invention

This invention relates to epitaxially grown films and devices and more particularly to a method of releasing such films and/or devices from the single crystal substrate upon which it is formed to enable its transfer to other substrates and reuse of the single crystal substrate.

Description of the Background Art

In thin film technology there has always been a tradeoff between the material quality of the film and the ease of depositing that thin film. Epitaxial films represent the highest level of quality, but they must be grown on and are accompanied by cumbersome, expensive, bulk single crystal wafer substrates. For some time, research has focused on the possibility of creating epitaxial quality thin films on arbitrary substrates while maintaining the ultimate in crystalline perfection.

The main approach has been to attempt to reuse the substrate wafer by separating it from the epitaxially grown film; however, to undercut a very thin film over its entire area without adversely affecting the film or the underlying substrate, the selectivity must be extremely high. This is very difficult to achieve. For example, J. C. Fan has described in Journale de Physique, 43, C1-327 (1982) a process in which an epitaxial film is cleaved away from the substrate on which it is grown. Such cleavage, at best, is difficult to achieve without damage to the film and/or substrate, or without removal of part of the substrate. Also, in some instances, the cleavage plane (<110>) and the growth plane (<100>) of the film may be mutually exclusive.

In a paper by Konagai et al appearing in J. of Crystal Growth 45, 277–280 (1978) it was shown that a Zn doped p-$Ga_{1-x}Al_xAs$ layer can be selectively etched from GaAs with HF. This observation was employed in the production of thin film solar cells by the following techniques. In one technique, zinc doped p-$Ga_{1-x}Al_xAs$ was grown by liquid phase epitaxy (LPE) on a n-GaAs grown layer on a GaAs single crystal substrate. During this LPE growth of the Zn doped $Ga_{1-x}Al_xAs$, Zn diffuses into the surface of the underlying GaAs to form a p-type GaAs layer and hence p-n GaAs junction. The surface p-$Ga_{1-x}Al_xAs$ is then selectively etched away leaving the p-n junction GaAs layers on the GaAs substrate.

In another solar cell fabrication process Konagai et al describe a "peeled film technology," which will be referred to here as lift-off technology. A 5 micron thick $Ga_{0.3}Al_{0.7}As$ film is epitaxially grown on a GaAs <111> substrate by LPE. A 30 micron thick Sn doped n-GaAs layer is then grown over the $Ga_{0.3}Al_{0.7}As$ layer and a p-n junction is formed by diffusing Zn into the specimen utilizing $ZnAs_2$ as the source of Zn. Appropriate electrical contacts are then formed on the films using known photoresist, etch and plating techniques. The surface layer is then covered with a black wax film support layer and the wafer is soaked in an aqueous HF etchant solution. The etchant selectively dissolves the the $Ga_{0.3}Al_{0.7}As$ layer which lies between the thin solar cell p-n junction device layers and the underlying substrate, allowing the solar cell attached to the wax to be lifted off the GaAs substrate for placement on an aluminum substrate. The wax provides support for the lifted-off film.

While the technique described above has been described in the literature for ten years, it was not adopted by the industry. One reason for this was a difficulty encountered in completely undercutting the $Ga_{0.3}Al_{0.7}As$ 'release' layer in a reasonable time, especially when the area of the film to be lifted-off was large. This difficulty arose due to the formation and entrapment of gas, formed as a reaction product of the etching process, within the etched channel. The gas created a bubble in the channel preventing or diminishing further etching and causing cracking in the epitaxial film. The problem could only be partially obviated by using very slow reaction rates (very dilute HF solutions). Since both the time required for lift-off and the risk of damage to the overlying film are important, the process was virtually abandoned.

A means for providing for the needed circulation of etchant and reaction products and the release of any gaseous reaction products of the etching process while maintaining high selectivity is therefore desired.

SUMMARY OF THE INVENTION

The present invention is directed to a process for selectively lifting off an epitaxial film from a single crystal substrate upon which it was grown and to device configurations employing such lift-off films.

The novel method comprises selectively etching away a thin release layer positioned between an epitaxial film and the substrate upon which it grown, while causing edges of the epitaxial film to curl upward as the release layer is etched away, thereby providing means for the escape and outdiffusion of the reaction products of the etching process from the area between the film and the substrate.

The present invention is further directed to novel structures employing such a lift-off film.

DETAILED DESCRIPTION OF THE INVENTION

The present invention is based upon the discovery of a unique means for lifting-off an epitaxial film from the substrate upon which it is grown so as to substantially eliminate the problem encountered in the past due to entrapment of gaseous reaction products in the channel formed during etching of a release layer between the film and the substrate.

In general terms, the present invention differs from the teachings of Konagai et al by providing means for lifting the edges of the epitaxial film as the release layer is selectively etched away, thereby creating a concave film surface. In this way, gaseous products of the etching reaction which otherwise tend to accumulate in the etched channel preventing further etching and causing cracking of the epitaxial film, can now escape from the channel. The means provided for lifting the edges of the epitaxial film is a support layer over the film which is applied to the film under tension causing the film to be under compression thereby creating a concave curvature in the film as the release layer is etched away. The invention has been partially described by Yablonovitch et al. in a technical article "Extreme Selectivity in the lift-off epitaxial GaAs films," Applied Physics Letters, Vol. 51, December 1987 at pages 2222-2224.

Figure 1:
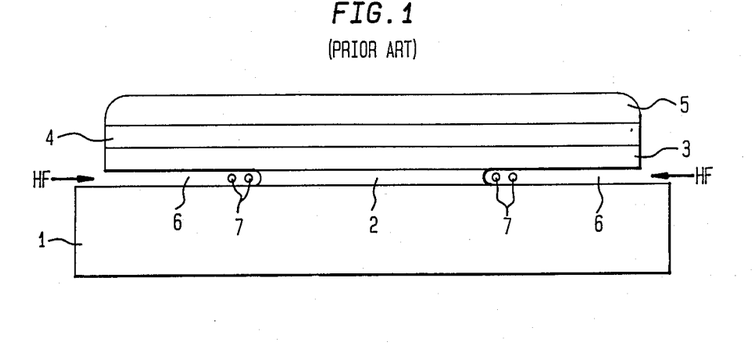
FIG. 1 is a side elevational view showing an epitaxially grown thin film semiconductor device being lifted off from an underlying single crystal substrate by the prior art etching technique.
Figure 2:
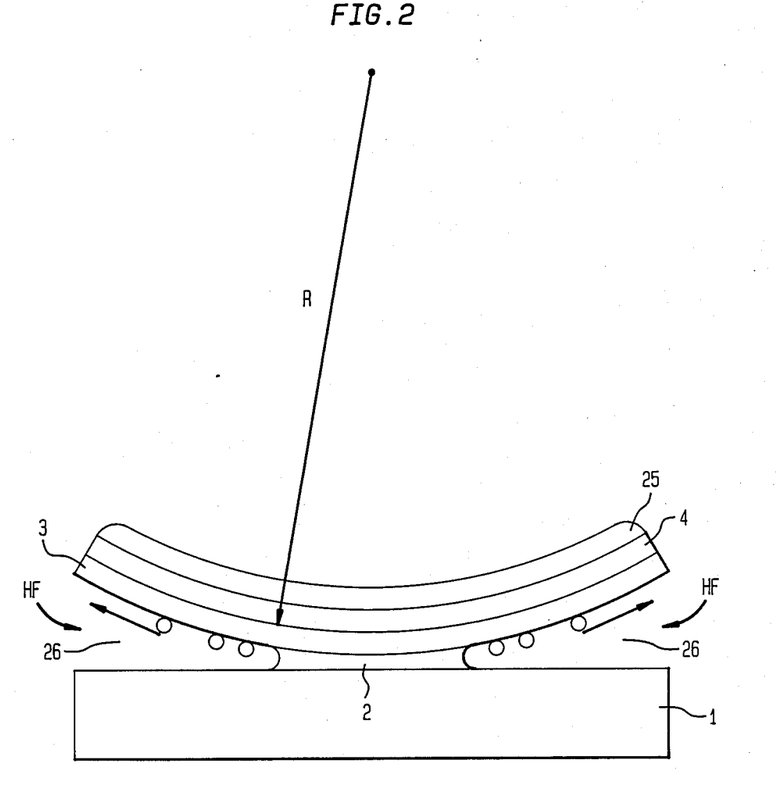
FIG. 2 is a side elevational view showing an epitaxially grown thin film semiconductor device being lifted off from an underlying single crystal substrate by the etching technique by the present invention.

The principle of the invention can best be understood with reference to FIGS. 1 and 2. FIG. 1, which illustrates the prior art etch technique, shows a single crystal GaAs substrate 1 having a thin release film 2 on the surface thereof and epitaxially grown p-type and n-type GaAs layers 3 and 4, forming a p-n junction device, thereon. A support layer 5 overlies the epitaxial layers 3 and 4. Here, as hydroflouric acid etches the release film 2 a uniformly thick channel 6 forms between the epilayer 3 and the substrate 1. As etching progresses, the gas reaction product, which has the lowest solubility of any of the reactants or reaction products, is difficult to diffuse away thereby limiting the undercutting speed and the permissible HF acid concentration. If the solubility limits are exceeded, bubbles 7 form at the reaction zone in the channel 6 displacing the etchant and producing a gas pressure which cracks the epitaxial film. Hence, permissible acid concentrations and therefore etch speeds are very low.

In comparison, FIG. 2 shows the results of the novel technique employing the same structure, but where a support layer 25 is applied so as to be under tension such that as undercutting of the release layer 2 occurs, the film curls with a radius of curvature R thereby forming a non-uniform channel 26 which is wider at the edges than the center of the film.

We have calculated the maximum permissible speed of undercutting for the case of the prior art plane parallel etching 6. Equating the diffusion flux with the etching flux:

$$vt3N = -Dt\frac{dn}{dz} \quad (1)$$

where v is the etching speed, n and N are the molar concentrations of dissolved gas and release layer (e.g. AlAs) respectively, t is the thickness of the channel, D is the diffusion constant of the gas, and z is a position coordinate down the channel. It is assumed that 3 moles of gas are produced for every mole of AlAs. By making this calculation, we see that thickness cancels from both sides of the equation, hence, contrary to intuition, a thick release layer which leads to a wider channel does not overcome the mass transport problem since proportionately more gas must be removed. Integrating equation (1) down a plane parallel channel of depth L results in a maximum undercutting speed v:

$$v = Dn/3LN \quad (2)$$

where n is now the saturation solubility of the gas. For an AlAs or a $Al_xGa_{1-x}As$ release layer where x is from 0.5 to 1, n/N is approximately $2 \times 10^{-5}$ and D in aqueous media is about $5 \times 10^{-5}$ cm$^2$/sec. Hence, the speed of removal of the release layer is severely limited in channels of any significant depth. However, if the channel opens up by virtue of the curvature shown in FIG. 2, then the outdiffusion becomes much easier.

Equating again, the etching flux with the diffusion flux for the novel method as depicted with reference to FIG. 2:

$$vt3N = -D\left(t + \frac{z^2}{2R}\right)\frac{dn}{dz} \quad (3)$$

where R is the radius of curvature induced by the tension in the support layer. Integrating this equation we get $$v = \frac{1}{3\pi\sqrt{Rt/2}} \frac{Dn}{N} \quad (4)$$

Comparing equations (2) and (4) it can be seen that the effective depth "L" of the channel is fixed at a small value $\pi\sqrt{Rt/2}$, which is roughly the geometric mean of R and t and independent of the actual depth. Since t is a microscopic quantity representing the thickness of the release layer, and the radius of curvature, R, is typically a few centimeters, the effective depth L can be as little as 30 microns even when the actual channel depth is one hundred times deeper. Hence, we have found that contrary to intuition, using the novel method, the need to transport reaction product away from the etching zone (the interface of acid and release layer) is best satisfied by making the release layer as thin as possible. Typically, we have employed release layers of less than 100 nm in thickness and some as thin as 2 nm.

After etching is complete, the epitaxial layers remain supported by the support layer and may be transferred to another substrate leaving the expensive single crystal original substrate available for re-use.

The films may be adhered to the new substrate, e.g. glass, diamond, silica, sapphire, quartz, metal, etc. by bonding the film, e.g., with an ultraviolet curable cement of the type used to splice optical fibers or, as is known in that art, with other compatible adhesives. In this way, a permanent support for large area crack free, lifted-off films can be made.

Alternatively, we have discovered that GaAs epitaxial films, for example, can be directly "optical contacted" to certain substrates, e.g. glass or silicon due to strong Van der Waals forces bonding the surfaces of the film to the substrate without the need for adhesives. The support layer can be washed away with an appropriate solvent.

Figure 3:
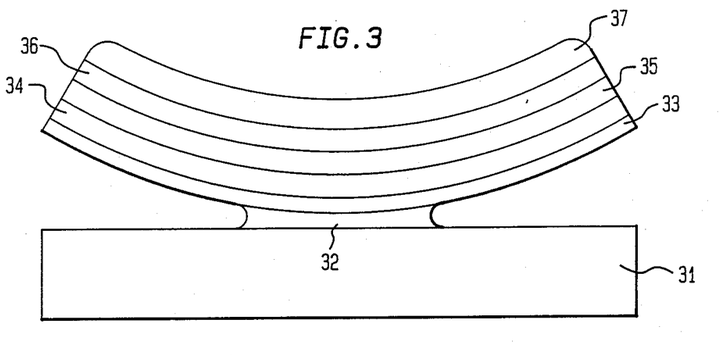
FIG. 3 is a side elevational view depicting a double heterostructure test device for measuring parameters of the films obtained from the novel lift-off process.

In order to determine the material quality and the etching characteristics, measurements of contactless minority-carrier lifetime decay was taken employing a double heterostructure as shown in FIG. 3. In accordance with this structure, a release layer 32 having a thickness of about 100 nm (can be as little as 2 nm) is grown on a GaAs:Cr substrate 31. A 50 nm thick GaAs epitaxial layer 33 is formed over the release layer 32 followed by epitaxial layers 34, 35 and 36 consisting of $Al_xGa_{1-x}As$ (500 nm), GaAs (2 $\mu$m), and $Al_xGa_{1-x}As$ (500 nm) respectively wherein $x \leq 0.4$. A support layer 37, under tension, is provided over the top $Al_xGa_{1-x}As$ layer. The minority-carrier lifetime in this structure may be very long. A surface layer of $Ga_{1-x}Al_xAs$ as thin as 10 nm is able to confine the minority-carriers within the GaAs layer 35 potential well. When the upper $Al_xGa_{1-x}As$ layer is etched away, the minority-carrier lifetime becomes very short due to the surface recombination. Therefore, the structure permits a sensitive measure of very small etch rates.

By monitoring the minority-carrier lifetime of the GaAs potential well capped by the thin $Al_xGa_{1-x}As$ layers as a function of etch time and of composition x, we determined some of these important parametric dependences. We found that the etch rate of $Al_{0.4}Ga_{0.6}As$ in concentrated (48%) HF acid could be very slow, only $\approx 0.15$ nm per hour, at room temperature and even slower at 0° C. We must assume that the etch rate of pure GaAs is yet again slower. By contrast, an increase in aluminum concentration from 40 to 50% increases the etch rate by many orders of magnitude. Based upon the speed at which the AlAs release layers are undercut, the etch rate can be as high as 1 mm per hour (depending upon and roughly proportional to HF acid concentration). Such a degree of selectivity ($\geq 10^7$) might be associated with percolation type behavior or possibly a shift from T-point minimum to X-point minimum in the band structure. In optimizing the lift-off process we standardized the release layer composition to pure AlAs but $Al_xGa_{1-x}As$ layers where x is $\geq 0.5$ were equally successful.

Figure 4:
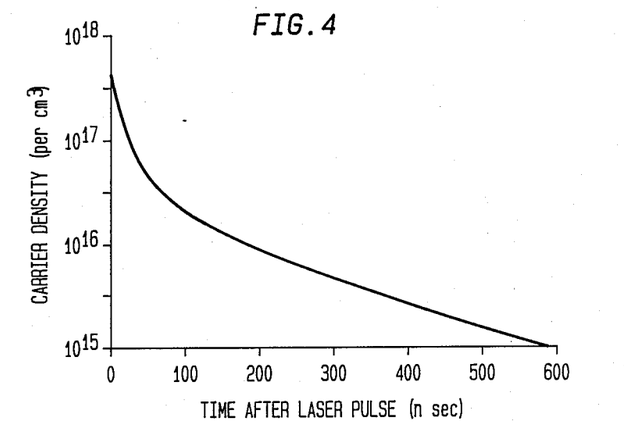
FIG. 4 shows the minority-carrier lifetime decay curve of the double heterostructure device of FIG. 3, both before and after lift-off, plotting carrier density (carriers/$cm^3$) vs. time (sec.) after application of an excitation pulse.

The films were grown on <100> oriented GaAs substrates by molecular beam epitaxy and organometallic chemical vapor deposition. The superb electronic quality of epitaxially grown films is unaffected by the lift-off process. This may be seen from the minority-carrier lifetime decay curves shown in FIG. 4. Minority-carrier lifetime is one of the best measures of crystalline perfection and purity. The test structure shown in FIG. 3 was monitored by a contactless lifetime probe technique as is known in the art. For comparison, the carrier density decay curve was measured before lift-off and then again after lift-off. The two decay curves overlay identically so there is only one curve actually shown in FIG. 4. This indicates that the lift-off film did not suffer any damage or cracking with the novel process. The initial rapid decay is due to radiative electron-hole recombination, and the slow decay at lower density measures the Shockley-Read-Hall lifetime.

EXAMPLE 1

In accordance with the novel process, a solution, e.g., 25 grams of support layer material in 100 ml solvent is sprayed onto a finished GaAs wafer having the epitaxially grown release layer and device layers thereon through a shadow mask and the solvent is evaporated. This is done several times to build up the support layer thickness. A preferred support layer material is a polymeric material known as Apiezon W which is readily soluble in trichloroethylene. This material is a mixture consisting of 62% paraffinic hydrocarbon polymer and 38% asphaltene hydrocarbons. Typically the thickness of the support layer is from 0.1 mm to 1 mm.

The support layer is then air cured for about ½ hour and the wafer is then placed in an oven at about 100° C. for about ½ hour to cure the support layer. This heating process produces the tension which causes the curvature upon etching of the release layer. The epitaxial layer edges around the support layer are then exposed by removing the support layer from around the edges with a solvent and then etching non-selectively or by cleavage. The sample is then placed in HF acid solution. Typically, 10% HF acid concentrations are employed, concentrated HF being a 48% solution. The sample is allowed to sit in the HF for up to about 24 hours or more and the GaAs epitaxial film supported by the support layer simply floats off or is detached from the substrate. The film may then be removed and adhered to any other desired substrate.

We have also discovered that the selectivity of etching of the release layer can be enhanced if etching is accomplished at reduced temperatures, e.g. about 0° C.

While Apiezon W is a preferred support layer which when treated as stated gives the desired result, it will be obvious to those skilled in the art that the support layer may be any polymeric material, which is cured or further cured after adhering it to the surface of the film to be removed such that the bonds formed upon curing are under tension due to adhesion to the film.

It should be understood that the epitaxial film being removed may be a single layer or multiple epitaxial layers and metallized to provide means for making electrical contact thereto and forming a semiconductor device. It should be further understood that the concept described herein is not limited to any particular semiconductor material, release layer or support layer and the principles can be employed with any compatible layers wherein a release layer can be selectively etched and undercut from between a single substrate and a overlying epitaxial semiconductor layer.

Figure 5:
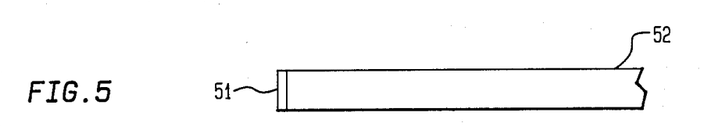
FIGS. 5–7 show various structures of a lifted-off semiconductor film adhered to a glass fiber in a manner so as to provide a coupled semiconductor device-fiber structure.
Figure 6:
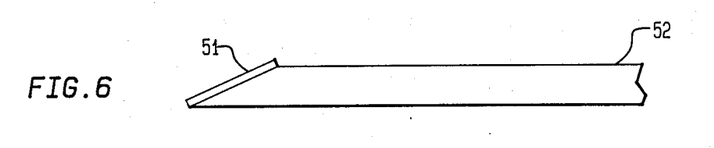
Figure 7:
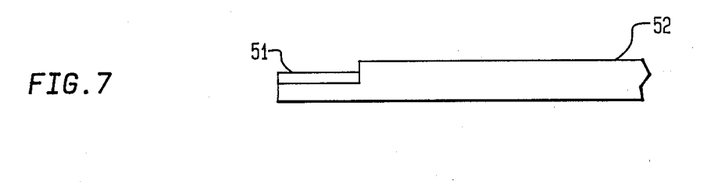

The novel process described above allows one to make structures employing epitaxial films which otherwise have not been possible. For example, a free epitaxial film comprising layers forming a light emitting diode, a laser, a photodetector or a photovoltaic device 51 may be directly adhered to an optical fiber or fiber bundle 52 as depicted in FIGS. 5-7 by means of an adhesive or by an adhesiveless optical contact using Van der Waals forces as previously described. Such structures will eliminate and/or reduce the problems of optical coupling normally associated with such devices in optical systems.

EXAMPLE 2

Figure 8:
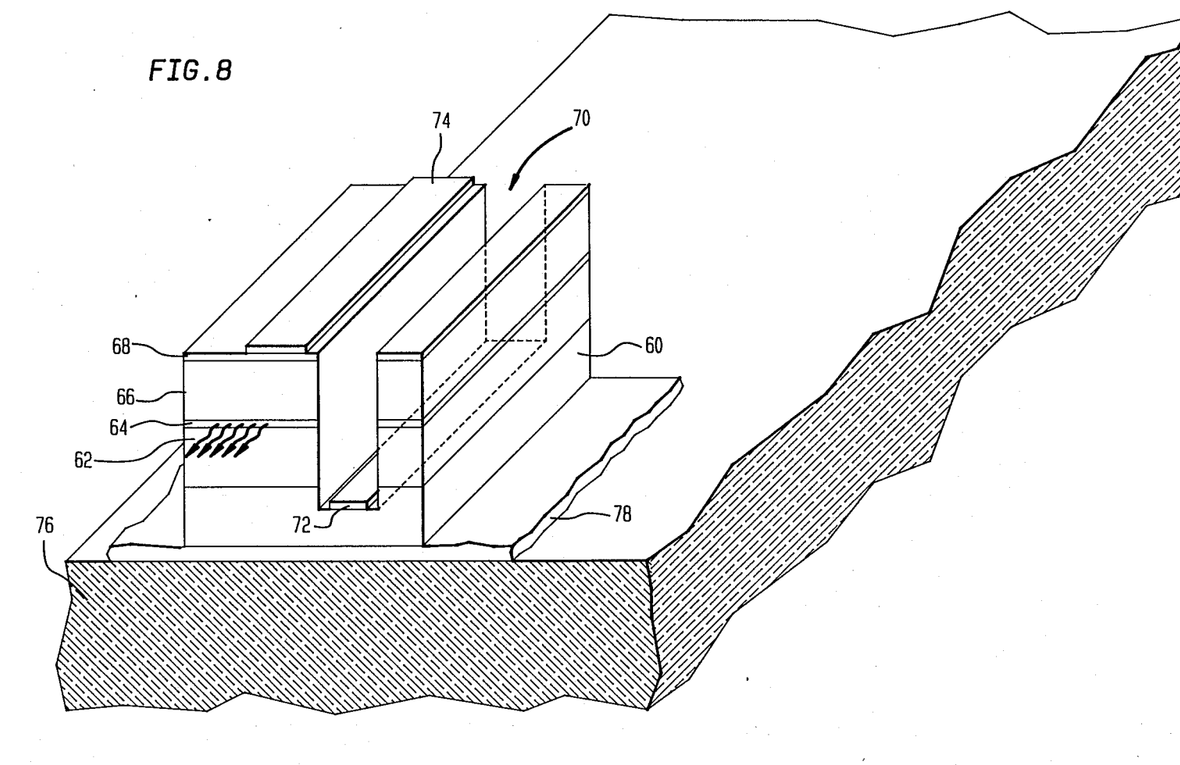
FIG. 8 is a pictorial illustration, partly in section, of a complete laser device bonded to a glass substrate.

In a second example, an AlGaAs laser was grown on a GaAs substrate and then lifted off and transferred to a glass substrate. The finished device is illustrated in FIG.

8. The films were grown on the <100> face of the GaAs substrate by organometallic chemical vapor (OMCVD) growth. The lowest layer was a release layer 50 nm thick of n+-AlAs.

Since the intended substrate was an insulator, a conductive epilayer 60 of n+-GaAs was grown to a thickness of 1.5 μm over the release layer. The remaining laser structure was conventional and included a 1.5 μm n-$Al_{0.3}Ga_{0.7}As$ waveguiding layer 62, a 0.2 μm GaAs active layer 64, a 1.5 μm p-$Al_{0.3}Ga_{0.7}As$ waveguiding layer 66 and a 0.2 μm p+-GaAs ohmic contact layer 68. A channel 70 was etched down to allow contact to the conductive epilayer 60. An n-contact 72 of Au-Ge and a p-contact 74 of Au-Ti were deposited.

The support layer material of Apiezon W was applied and then the GaAs growth substrate and the epitaxial layers were cleaved to 0.5 mm×5 mm. The 0.5 mm length defined the optical cavity and the 5 mm length allowed space for 5 parallel lasers. The individual chips were immersed in 10% HF to dissolve the release layer and to separate the epilayers from the growth substrate.

The Apiezon W allowed easy handling of the separated laser layers which were then mounted on a borosilicate glass substrate 76 by a UV curable optical fiber splicing cement 78, such as Norland 61. The wax was removed by trichloroethylene.

The lasers were tested and found to have the same laser threshold current before and after lift-off.

The use of the optical cement 78 allows the adhesion of the fabricated device to almost any device substrate including $SiO_2$. Van der Waals bonding of devices to substrates is generally feasible and would be particularly advantageous for device substrates having good thermal conductivity, such as diamond. However, the slight lattice mismatch between the GaAs active layer 64 and the AlGaAs waveguiding layers 62 and 66 in device of FIG. 5 caused the device to be concave downward and hence difficult to Van der Waals bond. Nonetheless the desired convex curvature can be obtained by selection of relative layer thicknesses in the original laser structure.

EXAMPLE 3

In a third example, an epitaxial GaAs film was lifted off a GaAs growth substrate and Van der Waals bonded to a silicon device substrate, on which it was used as a growth substrate for further epitaxial growth.

Molecular beam epitaxy was used to epitaxially deposit a 50 nm AlAs release layer and a 500 nm GaAs lift-off layer on a <100> face of a GaAs growth substrate. After application of the Apiezon W support layer, the GaAs lift-off layer was lifted off with 10% HF acid at 0° C. in the procedure described before.

Figure 9:
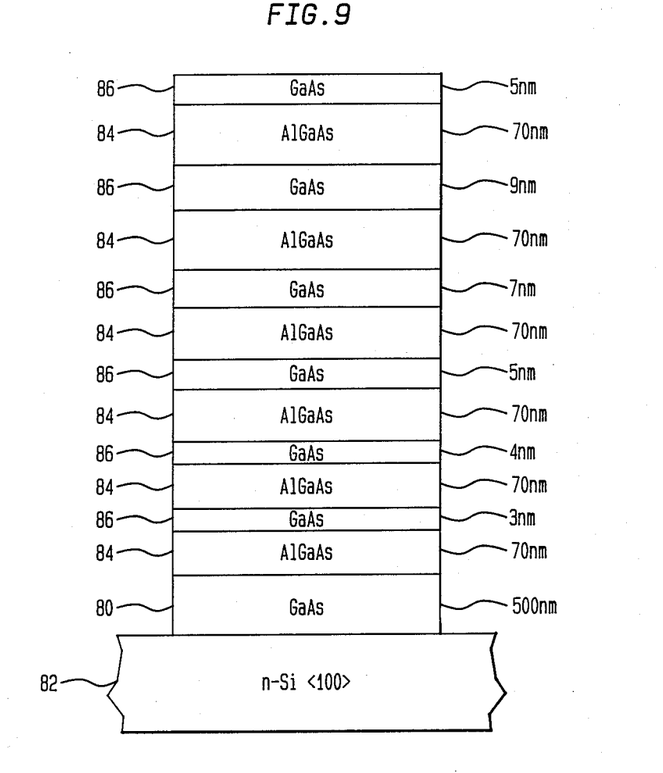
FIG. 9 is a cross-sectional view of a GaAs-AlGaAs structure epitaxially regrown on a Van der Waals bonded lift-off layer.

Then, as shown in FIG. 9, the GaAs lift-off layer 80 was Van der Waals bonded to a <100> face of an n-type Si substrate 82 by the following method. With the upper surface of the lift-off layer 80 held by the Apiezon W, a tiny drop of water was applied to the lower surface. Other liquids may be substituted for the water. Handling of the Apiezon W supported the lift-off layer 80 was performed manually with polypropylene or teflon tweezers. The side of the lift-off layer 80 with the water drop was set down on the Si substrate 80. A rubber roller was rolled with hand pressure on the black wax support layer so as to push the lift-off layer 80 onto the Si substrate 82. Most of the water thereby squeezed out around the edges of the lift-off layer 80. A similar bonding procedure done on a glass laboratory slide as a substrate produced a single interference fringe indicating a liquid thickness at this stage of about 100 nm. The bonded pair was then left at room temperature and pressure for about 24 hours so that the remainder of the water diffused to the edge and evaporated to thereby complete the Van der Waals bonding. The Apiezon W was removed by immersion and rinsing in trichloroethylene. The bonded sample was air dried for about 16 hours and thereafter placed in a vacuum chamber with a graphite heating stage which was evacuated. The sample was gradually heated over 4 ½ hours to 580° C., then cooled to room temperature and removed from the vacuum chamber. The slow heating in a vacuum reduced blistering due to entrapped dust particles. Clean room handling would further reduce the dust problem.

The GaAs lift-off layer 82 was then used as a substrate for epitaxial OMCVD growth of a GaAs-AlGaAs structure at 700° C. The bonded lift-off layer 80 and Si substrate 82 were placed in an OMCVD reaction chamber and slowly heated to 750° C., which acted to clean the surface. Thereafter, regrowth $Al_{0.48}Ga_{0.52}As$ layers 84 and GaAs layers 86 were grown with the thicknesses shown in FIG. 9.

Figure 10:
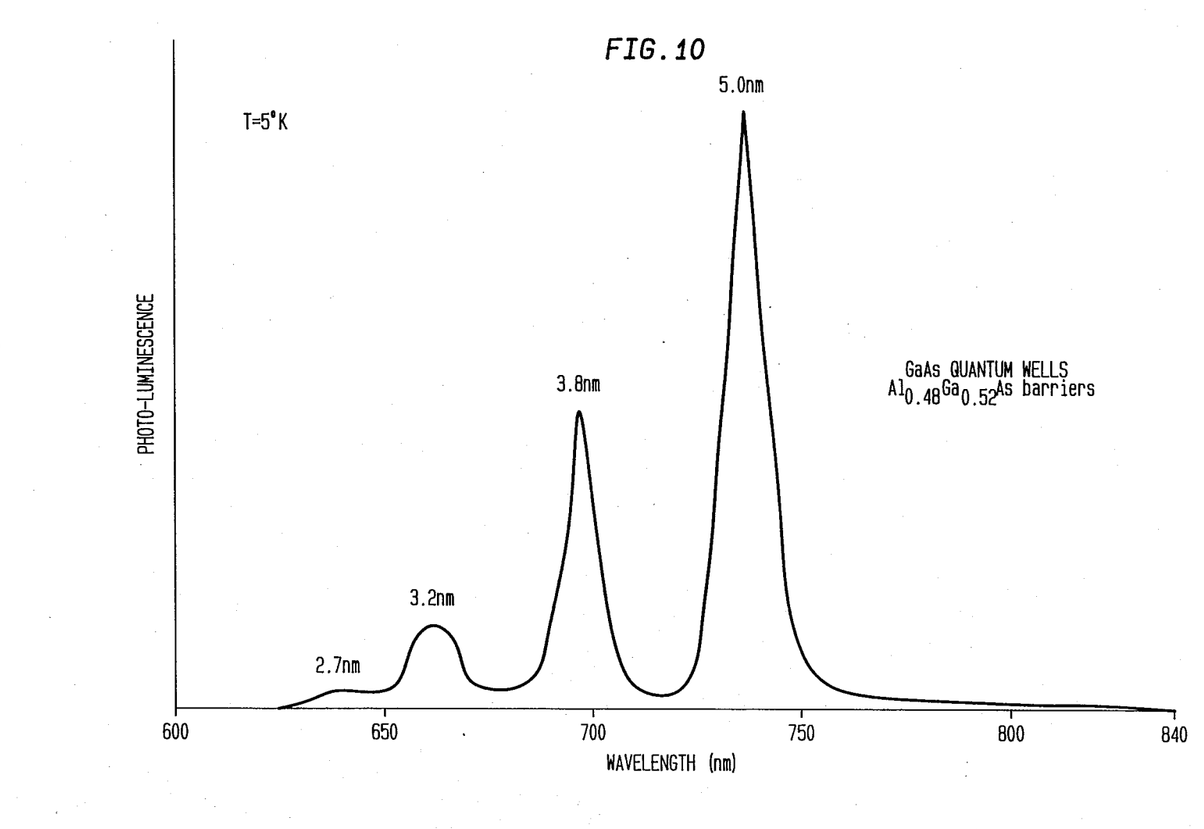
FIG. 10 is a graph of photo-luminescence data for the structure of FIG. 9.

The thicknesses of the regrowth GaAs layers 86 were chosen to provide energy band increases due to the narrow layers 86, which are called quantum wells in this art. The fabricated sample of FIG. 9 was tested for photoluminescence at 5° K. The resultant spectrum shown in FIG. 10 can be interpreted as showing layer thicknesses of 5.0, 3.8, 3.2 and 2.7 nm with relatively small layer thickness variations.

The high quality epitaxial layers fabricated by the above process demonstrate that more complicated structures, such as that in FIG. 8, can be grown on the lift-off layer 80 after its bonding to the Si substrate 82.

Several points should be noted for the GaAs-on-Si structure. Although the lift-off layer 80 is of epitaxial quality and is in contact with and bonded to the Si substrate 82, it is not epitaxial to the Si substrate. There has been considerable effort in the past toward growth of epitaxial III–V films which has been accomplished for epitaxial growth on other crystalline III–V substrates, crystalline Si substrates and crystalline $Al_2O_3$ substrates. However, in each case, the epitaxial film is epitaxial with its supporting substrate. That is, the atoms of the film are in registry with the atoms of the substrate. It is inconceivable that the atoms of the lift-off layer 80 Van der Waals bonded to the device substrate 82 are in registry with the atoms thereof. It is thus seen that the above-described method provides the only known method to contact over a larger area a crystalline thin film (defined herein as being 10 μm or less in thickness) to a substrate with which it is non-epitaxial and without the use of adhesives.

A second point is that the OMCVD growth was performed at a relatively high growth temperature of 700° C. Any adhesive contacting the lift-off layer to the substrate would likely degrade at these temperatures.

A third point is that the silicon substrate 82 of FIG. 9 could be used both for the AlGaAs regrowth and for silicon growth. Therefore, the same Si wafer can serve as a substrate for III–V devices and for Si devices grown according to standard Si technology. The most obvious combination is one part of a chip devoted to III–V opto-electronics and another part devoted to Si electronics driving the opto-electronics.

If the silicon substrate 82 were oxidized prior to the Van der Waals bonding of the GaAs lift-off layer 80 to form a silicon oxide layer, nonetheless the lift-off layer 80 could still be Van der Waals bonded to the silicon oxide layer. The silicon oxide layer would be amorphous (non-crystalline), which designation has significance only for layers of thicknesses greater than 0.3 nm.

Figure 11:
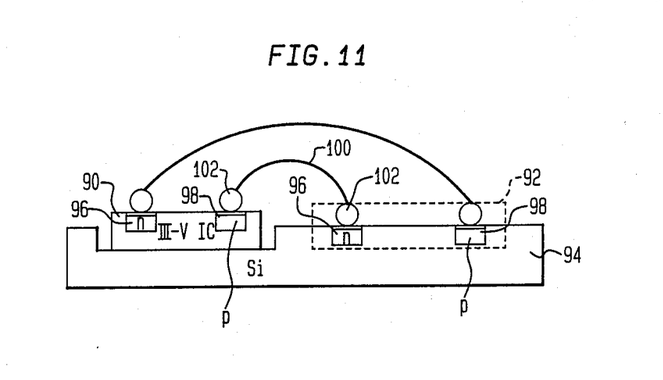
FIGS. 11, 12 and 13 show three embodiments of a III-V device integrated with a silicon integrated circuit and their interconnects.

In FIG. 11 is shown a III-V thin film device 90 integrated with a silicon microcircuit 92 on a silicon substrate 94. The III-V device 90 may be a single device, such as the laser of FIG. 8, or a very fast integrated circuit integrated on the substrate 94 with a slower silicon integrated circuit 92. The silicon integrated circuit 92 may be diffused or implanted into the silicon substrate 94 or may include a Si epitaxial layer grown on the Si substrate 94.

This mixed material integrated circuit can be fabricated in at least three different sequences. The completed III-V device 90 can be bonded by adhesive or Van der Waals bonding to the substrate 94 after the silicon integrated circuit has been completed. The silicon integrated circuit 92 can be grown after Van der Waals bonding of the completed III-V device 94. A III-V lift-off layer may be bonded to the silicon substrate 94 either before or after fabrication of the silicon integrated circuit 92, and thereafter used for growth of the III-V device.

The Van der Waals bonding technique allows the production as a commodity item of silicon substrates with a III-V thin film surface bonded thereto. Such a substrate could then be stored and/or sold before further specialized processing. If the mixed material integration of FIG. 11 is then desired, the III-V material can be removed in a selected area to allow Si processing of the Si substrate but allowing III-V processing of the unremoved film.

Figure 12:
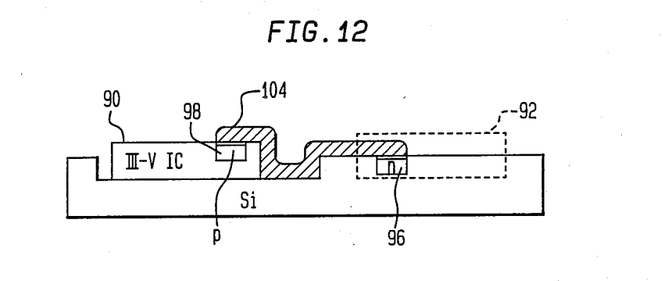
Figure 13:
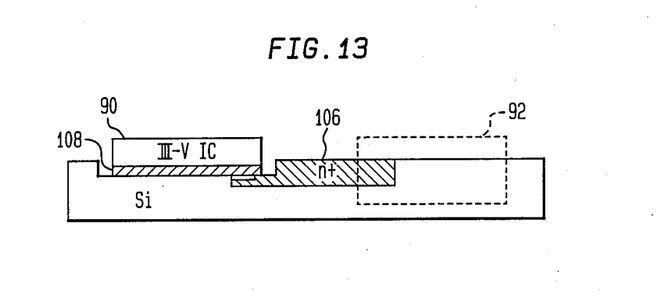

The interconnections between III-V device 90 and the silicon integrated circuit can be accomplished in one of several ways. As illustrated in FIG. 11, n-wells 96 and p-wells 98 are formed in both the III-V device 90 and silicon integrated circuit 92, each having at the surface an alloy metal contact layer of the proper composition to form an ohmic contact with the underlying material. Two wells 96 and 98 of opposite conductivity type are then interconnected with a gold wire 100 and gold bonds 102. Alternatively, as illustrated in FIG. 12, a metallic interconnect 104 can be defined between the wells 96 and 98 by photolithography and evaporation. A buried metal contact is shown in FIG. 13 in which an n+ region 106 is formed from the silicon integrated circuit 92 to beneath the location of the III-V device 90. An alloy metal contact is formed at the surface of the n+ region 106. A metal pad 108 is deposited over the alloy metal contact. A segmented metal pad is possible for multiple contacts. Then a III-V lift-off or III-V device 90 is Van der Waals bonded to the metal pad 108.

EXAMPLE 4

Figure 14:
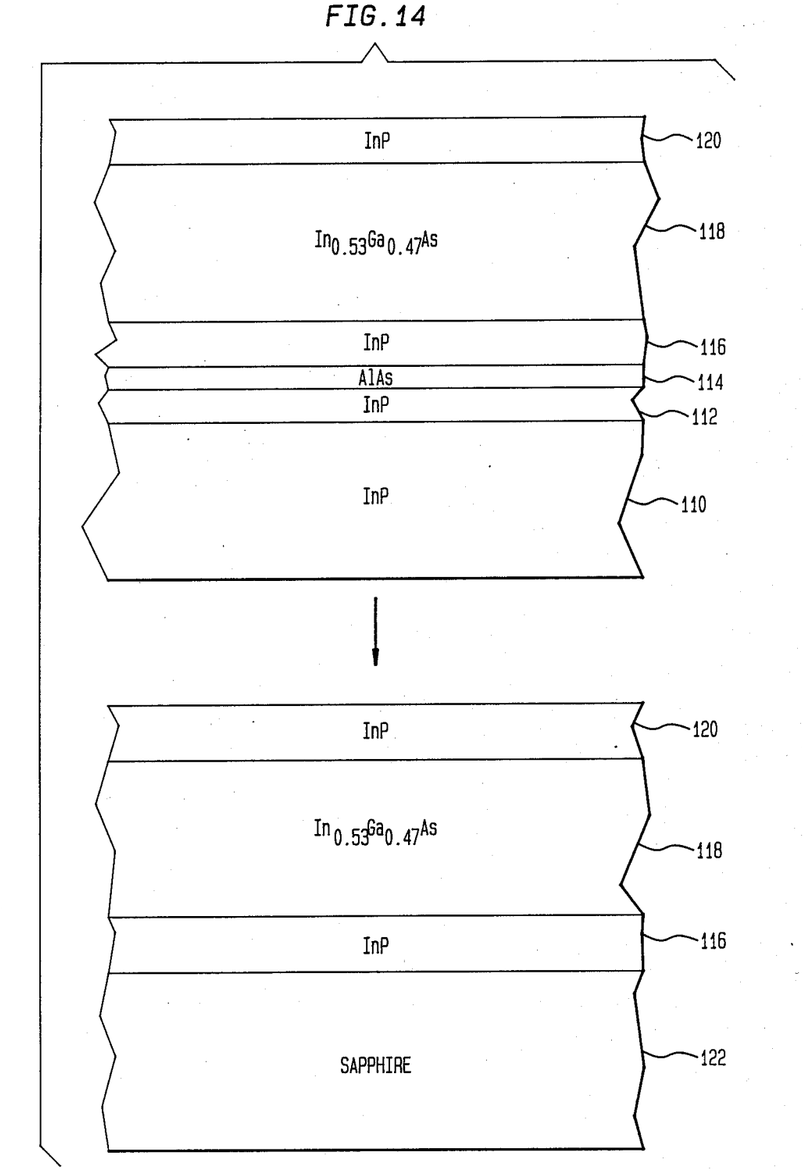
FIG. 14 is a cross-sectional view of an InP-InGaAsP system double heterostructure both before lift-off and after bonding.
Figure 15:
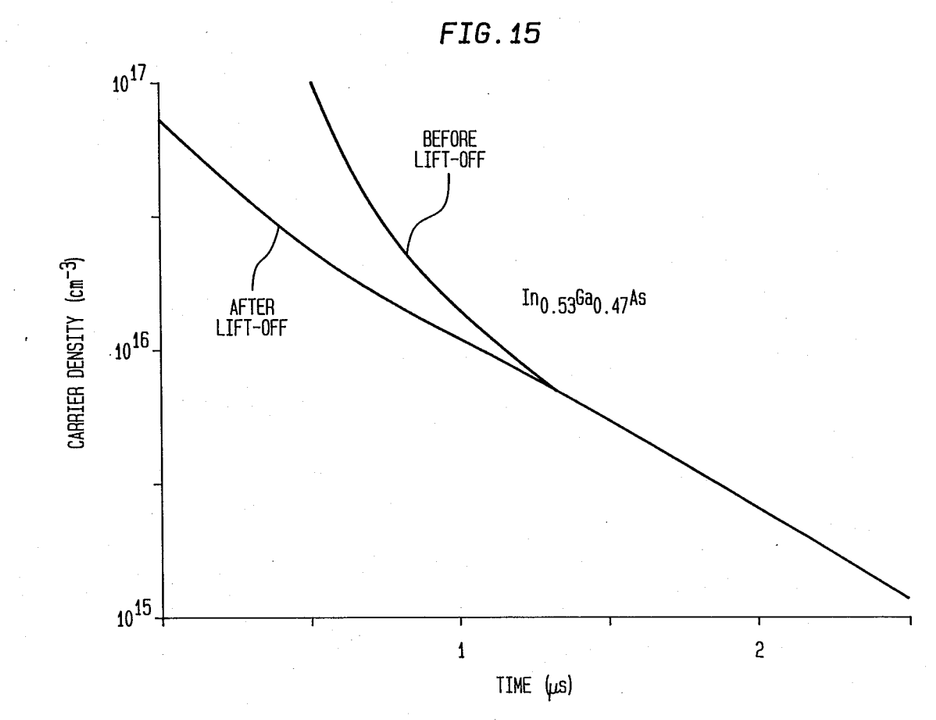
FIG. 15 shows the minority-carrier decay curves for the double heterostructures of FIG. 14.

A fourth example involved a InGaAsP system in which InP was used as the growth substrate. As shown in FIG. 14, a semi-insulating InP substrate 110 was used for growth by OMCVD. There were sequentially formed an InP buffer layer 112, an AlAs release layer 114 of 5 nm thickness and grown at 650° C. and a double heterostructure grown at 625° C. and comprising a first InP layer 116 of 100 nm, an $In_{0.53}Ga_{0.47}As$ layer 118 of 500 nm, and a second InP layer 120 of 100 nm. At this time, the minority carrier lifetime was measured with the heterostructure attached to the growth substrate 110 and found to be about 670 ns, as shown in FIG. 15.

The previously described lift-off procedure was then followed. The Apiezon W was applied and cured. The sample was vertically cleaved to expose the AlAs release layer and was etched in 10% HF for 16 hours at 0° C. Once the heterostructure was completely undercut, it floated off and was Van der Waals bonded to a single crystal sapphire ($Al_2O_3$) substrate 122 following the previously described bonding procedure.

When the Apiezon W had been removed by trichloroethylene, the minority carrier lifetime was again measured with the heterostructure bonded to the sapphire device substrate 122. At longer times (lower carrier densities), the decay rates are the same on the growth and on the device substrate. The differences at densities above $10^{16}$ cm$^{-3}$ have been determined to be due to inhibited spontaneous emission which is affected by nearby dielectric constants, in this case, the two different substrates.

Although epitaxial growth of GaAs on sapphire has been reported, there is no known art for InGaAsP on sapphire. More importantly, the chemistry of the device substrate is not particularly important so that Van der Waals bonding of InGaAsP to arbitrary substrates now seems possible.

A particularly suitable choice for coupling with an optical fiber or alternatively, for placement on a conductive substrate, is a lift-off film having a plurality of epitaxially grown doped and/or intrinsic layers of $In_x Ga_{1-x}As_y P_{1-y}$ wherein x and y can vary from 0 to 1 to produce a laser device. Such $In_x Ga_{1-x}As_y P_{1-y}$ lasers are well known in the art and are generally formed by molecular beam epitaxial growth of the layers on an InP substrate. Here, a thin (2 nm–10 nm) strained AlAs release layer is employed between the substrate and the active device layers and the film is lifted-off in accordance with the teachings of the present invention. InGaAsP is a quaternary semiconductor and is an example of multinary semiconductor having at least two principal components.

Other III-V compounds, II-VI compounds and even more general material systems should be usable with the lift-off and Van der Waals bonding of the invention. The lift-off requires a selective etch that preferentially attacks the release layer. The Van der Waals bonding appears to be nearly universally applicable to substrates which are insulators, metals, any semiconductor and amorphous materials.

What is claimed is:

1. A process for selectively freeing an epitaxial film from a single crystal substrate upon which it was grown, said method comprising the steps of
    selectively etching away a thin release layer positioned between said film and said substrate and causing edges of said film to curl upwardly as said release layer is etched away to enhance the outdiffusion of reaction products of the etching step from an active etching area,
    adhering said film to a second substrate, and depositing at least one semiconductor layer on said film adhered to said substrate.

2. The process recited in claim 1, wherein said semiconductor layer is epitaxial to said film.

3. A process for selectively freeing an epitaxial film from a single crystal film substrate upon which it was grown, said method comprising the steps of
    selectively etching away a thin release layer positioned between said film and said substrate and causing edges of said film to curl upwardly as said release layer is etched away to enhance the outdiffusion of reaction products of the etching step from an active etching area and adhering said film to a second substrate without any adhesive therebetween by means of Van der Waals forces, wherein said adhering step includes applying a liquid between said film and said second substrate and thereafter pressing said film and said substrate together so as to squeeze out said liquid from between said film and said second substrate.

4. A process for selectively freeing an epitaxial film from a single crystal substrate upon which it was grown, said method comprising the steps of selectively etching away a thin release layer positioned between said film and said substrate and causing edges of said film to curl upwardly as said release layer is etched away to enhance the outdiffusion of reaction products of the etching step from an active etching area, adhering said film to a second substrate, and growing at least one epitaxial semiconducting layer on said film adhered to said second substrate.

5. A process for selectively freeing an epitaxial film from a single crystal substrate upon which it was grown, said method comprising the steps of selectively etching away a thin release layer positioned between said substrate and causing edges of said film to curl upwardly as said release layer is etched away to enhance the outdiffusion of reaction products of the etching step from an active etching area, wherein said film comprises at least a partially formed electronic, optical, or electro-optical device, and epitaxially growing at least one semiconductor layer on said epitaxial film prior to said etching step, to at least partially form said device.

6. The process recited in claim 5, wherein said film comprises layers of $Al_xGa_{1-x}As$ and $0 \leq x \leq 1$ and wherein said release layer comprises $Al_zGa_{1-z}As$ and $z > 0.40$.

7. The process recited in claim 6, wherein said etching is performed with HF at lower than room temperature.

8. The process recited in claim 7, wherein said etching is performed at about 0° C.

9. The process recited in claim 5, wherein said film comprises layers in the $InP\text{-}In_xGa_{1-x}As_yP_{1-y}$ system, $0 \leq x \leq 1$ and $0 \leq x \leq 1$ and wherein said release layer comprises $Al_zGa_{1-z}As$ and $z > 0.40$.

10. The process recited in claim 9, wherein said etching is performed with HF at lower than room temperature.

11. The process recited in claim 10, wherein said etching is performed at about 0° C.

12. A process for selectively freely an epitaxial film comprising at least one layer of a multinary semiconductor from a single crystal substrate, said method comprising the steps of selectively etching away a thin release layer positioned between said film and said substrate and causing edges of said film to curl upwardly as said release layer is etched away to enhance the outdiffusion of reaction products of the etching step from an active etching area, adhering said film to a second substrate comprising silicon, and forming a silicon semiconducting device on said silicon second substrate.

13. A process for selectively freeing an epitaxial film comprising a device having an optical input or an optical output from a single crystal substrate upon which it was grown, said method comprising the steps of selectively etching away a thin release layer positioned between said film and said substrate and causing edges of said film to curl upwardly as said release layer is etched away to enhance the outdiffusion of reaction products of the etching step from an active etching area and adhering said film to a second substrate comprising an optical fiber, wherein said optical input or said optical output when mounted on said fiber is optically coupled thereto.

14. A process for mounting a thin film, comprising the steps of:

applying a liquid between a thin film and a solid bulk substrate; and thereafter pressing said film and said substrate together so as to squeeze out said liquid from between said film and said substrate, thereby adhering said film to said substrate.

15. The process as recited in claim 14, wherein said thin film comprises a crystalline semiconductor.

16. The process as recited in claim 15, wherein said thin film comprises a III-V semiconductor.

17. The process as recited in claim 16, wherein said substrate comprises silicon.

18. The process as recited in claim 16, wherein said substrate comprises a non-single-crystal material.

19. The process as recited in claim 15, further comprising forming an opto-electronic device in said thin film.

* * * * *

UNITED STATES PATENT AND TRADEMARK OFFICE
CERTIFICATE OF CORRECTION

PATENT NO. : 4,883,561

DATED : November 28, 1989

INVENTOR(S) : Thomas J. Gmitter, Eli Yablonovitch

It is certified that error appears in the above-identified patent and that said Letters Patent is hereby corrected as shown below:

The term of this patent subsequent to July 11, 2006, has been disclaimed.

Signed and Sealed this

Eighth Day of May, 1990

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,883,561

DATED : November 28, 1989

INVENTOR(S) : Thomas J. Gmitter and Eli Yablonovitch

It is certified that error appears in the above-identified patent and that said Letters Patent is hereby corrected as shown below:

Column 11, line 52, change "$0 \leq x \leq 1$ and $0 \leq x \leq 1$" to --$0 \leq x \leq 1$ and $0 \leq y \leq 1$--.

Signed and Sealed this

Seventh Day of January, 1992

Attest:

HARRY F. MANBECK, JR.

*Attesting Officer*     *Commissioner of Patents and Trademarks*